United States Patent
Kim et al.

(10) Patent No.: US 8,410,506 B2
(45) Date of Patent: *Apr. 2, 2013

(54) HIGH EFFICIENCY LIGHT EMITTING DIODE

(75) Inventors: Chang Youn Kim, Ansan-si (KR); Joon Hee Lee, Ansan-si (KR); Jong Kyun You, Ansan-si (KR); Hong Chol Lim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/077,371

(22) Filed: Mar. 31, 2011

(65) Prior Publication Data

US 2011/0227114 A1 Sep. 22, 2011

Related U.S. Application Data

(63) Continuation of application No. 12/986,774, filed on Jan. 7, 2011.

(30) Foreign Application Priority Data

Mar. 22, 2010 (KR) .......................... 10-2010-0025174
Jun. 25, 2010 (KR) .......................... 10-2010-0060291

(51) Int. Cl.
*H01L 33/00* (2010.01)
(52) U.S. Cl. .......................... 257/98; 257/99; 257/100

(58) Field of Classification Search ............. 257/98–100
See application file for complete search history.

(56) References Cited

U.S. PATENT DOCUMENTS

| | | | |
|---|---|---|---|
| 6,744,071 B2 | 6/2004 | Sano et al. | |
| 7,704,763 B2 | 4/2010 | Fujii et al. | |
| 2007/0166851 A1* | 7/2007 | Tran et al. | 438/22 |
| 2007/0295952 A1 | 12/2007 | Jang et al. | |

OTHER PUBLICATIONS

Non-Final Office Action of U.S. Appl. No. 12/986,774 was mailed Jan. 18, 2013.

* cited by examiner

*Primary Examiner* — Samuel Gebremariam
(74) *Attorney, Agent, or Firm* — H.C. Park & Associates, PLC

(57) ABSTRACT

Provided is a high-efficiency light emitting diode (LED) that includes: a support substrate; a semiconductor stack positioned on the support substrate, the semiconductor stack including a p-type compound semiconductor layer, an active layer, and an n-type compound semiconductor layer; a first electrode positioned between the support substrate and the semiconductor stack and in ohmic contact with the semiconductor stack; a first bonding pad positioned on a portion of the first electrode that is exposed outside of the semiconductor stack; and a second electrode positioned on the semiconductor stack. Protrusions are formed on exposed surfaces of the semiconductor stack. In addition, the second electrode may be positioned between the first electrode and the support substrate and contacted with the n-type compound semiconductor layer through openings of the semiconductor stack.

17 Claims, 3 Drawing Sheets

HIGH EFFICIENCY LIGHT EMITTING DIODE

CROSS-REFERENCE TO RELATED APPLICATIONS

This application is a continuation of U.S. patent application Ser. No. 12/986,774, filed on Jan. 7, 2011 and claims priority from and the benefit of Korean Patent Application No. 10-2010-0025174, filed on Mar. 22, 2010 and Korean Patent Application No. 10-2010-0060291, filed on Jun. 25, 2010, which are hereby incorporated by reference for all purposes as if fully set forth herein.

BACKGROUND OF THE INVENTION

1. Field

The present invention relates to high-efficiency light emitting diodes (LEDs).

2. Discussion of the Background

In general, since Group-III-element nitrides, such as gallium nitride (GaN) and aluminum nitride (AlN), have an excellent thermal stability and a direct-transition-type energy band structure, they have recently come into the spotlight as materials for visible and ultraviolet light emitting devices. Particularly, blue and green light emitting devices using indium gallium nitride (InGaN) are used in various applications, such as large-sized full-color flat panel displays, traffic lights, indoor illumination, high-density light sources, high-resolution output systems, and optical communications.

Since it is difficult to fabricate a homogeneous growth substrate for Group-III-element nitride semiconductors, Group-III-element nitride semiconductor layers are grown on a heterogeneous substrate having a crystal structure similar to that of the Group-III-element nitride semiconductor, through processes such as metal organic chemical vapor deposition (MOCVD) or molecular beam epitaxy (MBE). A sapphire substrate having a hexagonal grain structure is frequently used as the heterogeneous substrate. However, since sapphire is an electrical insulator, it limits the structure of a light emitting diode (LED) formed thereon. Accordingly, there has recently been developed a technique in which epitaxial layers, such as nitride semiconductor layers, are grown on a heterogeneous substrate such as sapphire, a support substrate is bonded to the epitaxial layers, and the heterogeneous substrate is then separated using a laser lift-off technique or the like, thereby fabricating a high-efficiency vertical-type LED (e.g., see U.S. Pat. No. 6,744,071).

FIG. 1 is a sectional view illustrating a conventional LED. Referring to FIG. 1, a conventional vertical-type LED is fabricated by sequentially forming a GaN-based n-type layer 23, a GaN-based active layer 25, and a GaN-based p-type layer 27 on a growth substrate (not shown), forming a p-electrode 39 having a reflective metal layer on the p-type layer 27, flip-bonding the p-electrode 39 to a Si submount 41 using a bonding metal 43, removing the growth substrate, and then forming an n-electrode 37 on the exposed n-type layer 23. An n-electrode 45 is then formed on the bottom surface of the Si submount 41. Furthermore, in U.S. Pat. No. 7,704,763, the surface of the exposed n-type layer 23 is roughened using a dry or photo-enhanced chemical (PEC) etching technique, thereby enhancing the light extraction efficiency.

In addition, the support substrate is generally a conductive substrate in such a conventional LED. Thus, the conventional LED has a vertical-type structure, in which the n-electrode and the p-electrode are disposed opposite to each other.

However, in the conventional LED, since only the upper surface of the n-type layer 23 is roughened, light loss occurs due to the internal total reflection generated at side surfaces of the semiconductor stack 20. Further, since the n-electrode 37 or an n-electrode pad is positioned on the n-type GaN layer, the light generated in the active layer can be absorbed or reflected by the n-electrode 37, decreasing the light extraction efficiency. In addition, Ag is frequently used to form a reflection layer that is in ohmic contact with the p-type GaN layer. However, the Ag may be easily aggregated during a thermal treatment process, which results in current leakage, due to the migration of Ag atoms, during operation of the LED. Therefore, it is difficult to form a stable reflection layer using Ag. Furthermore, Ag has reflectance limitations because it is a metallic material.

SUMMARY OF THE INVENTION

Exemplary embodiments of the present invention provide a high-efficiency light emitting diode (LED) having excellent light extraction efficiency.

Exemplary embodiments of the present invention provide a high-efficiency LED that can prevent light generated in an active layer from being absorbed or reflected by an electrode and/or electrode pad.

Exemplary embodiments of the present invention provide a high-efficiency LED having improved reflectance of light directed toward a support substrate.

Additional features of the invention will be set forth in the description which follows, and in part will be apparent from the description, or may be learned by practice of the invention.

An exemplary embodiment of the present invention discloses an LED comprising: a support substrate; a semiconductor stack positioned on the support substrate, the semiconductor stack including a p-type compound semiconductor layer, an active layer, and an n-type compound semiconductor layer; a first electrode positioned between the support substrate and the semiconductor stack and in ohmic contact with the semiconductor stack, the first electrode having a region that is exposed outside of the semiconductor stack; a first bonding pad positioned on the exposed region of the first electrode and electrically connected to the first electrode; and a second electrode positioned on the semiconductor stack. The semiconductor stack may be frusto-pyramidal in shape, and protrusions may be formed on exposed surfaces of the semiconductor stack.

Another exemplary embodiment of the present invention provides an LED comprising: a support substrate; a semiconductor stack positioned on the support substrate, the semiconductor stack including a p-type compound semiconductor layer, an active layer, and an n-type compound semiconductor layer, the p-type compound semiconductor layer being positioned closer to the support substrate than the n-type compound semiconductor layer, the semiconductor stack having an opening formed in the p-type compound semiconductor layer and the active layer, exposing the n-type compound semiconductor layer; a p-electrode positioned between the p-type compound semiconductor layer and the support substrate and in ohmic contact with the p-type compound semiconductor layer, the p-electrode having a portion exposed to the outside of the semiconductor stack; an n-electrode positioned between the p-electrode and the support substrate and in contact with the n-type compound semiconductor layer through the opening; and a reflective insulating layer positioned between the p-electrode and the n-electrode, to insulate the p-electrode from the n-electrode and to reflect light away from the support substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
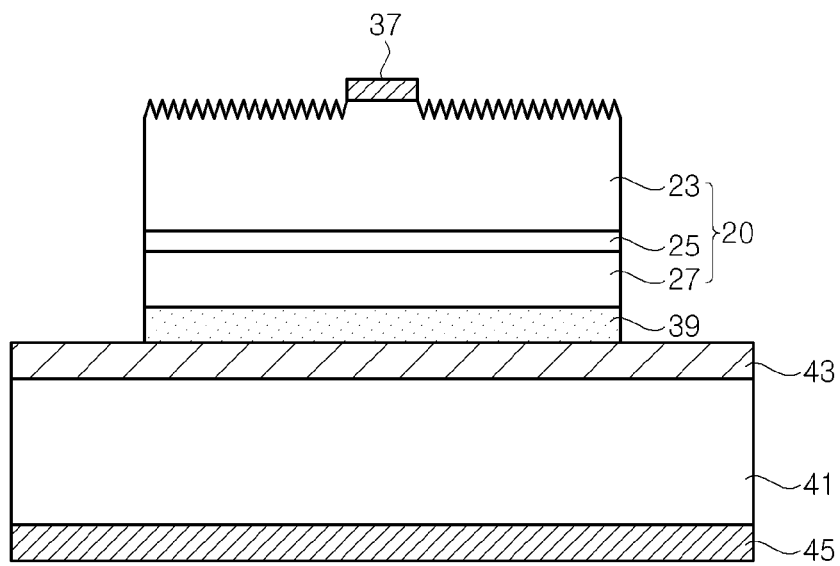
FIG. 1 is a sectional view illustrating a conventional vertical type light emitting diode (LED).

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
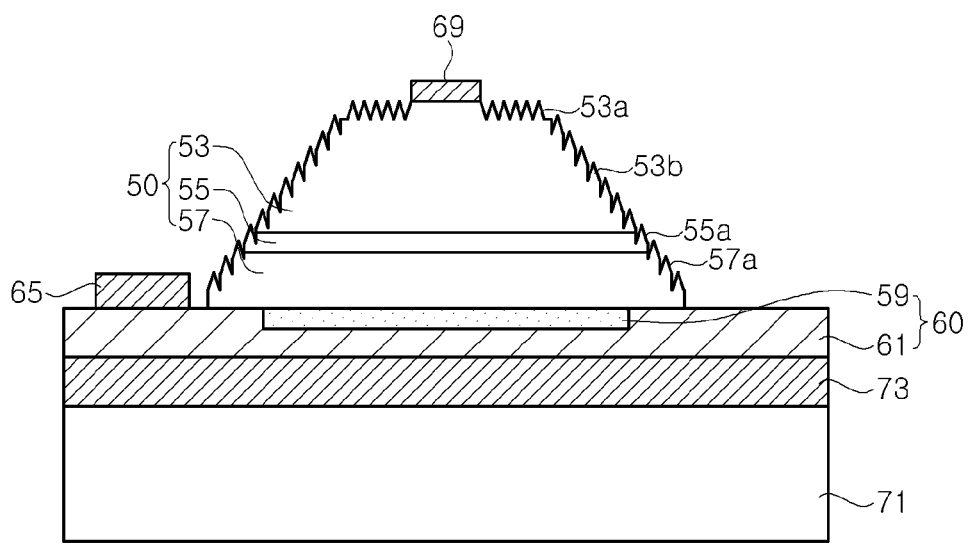
FIG. 2 is a sectional view illustrating an LED, according to an exemplary embodiment of the present invention.

FIG. 2 is a sectional view illustrating a light emitting diode (LED), according to an exemplary embodiment of the present invention. Referring to FIG. 2, the LED comprises a support substrate 71, a bonding metal 73, a semiconductor stack 50, a p-electrode 60, an n-electrode 69, and a p-bonding pad (p-electrode pad) 65.

The support substrate 71 is distinguished from a growth substrate that is used to grow compound semiconductor layers, and is a secondary substrate attached to the previously grown compound semiconductor layers. Although the support substrate 71 may be a sapphire substrate, it is not limited thereto, as the support substrate may be any suitable insulating or conductive substrate. Particularly, in a case where a sapphire substrate is used as the growth substrate, the support substrate 71 may have a thermal expansion coefficient similar to that of the growth substrate. Hence, it is possible to prevent a wafer from being bent when bonding the support substrate and/or removing the grown substrate. Further, it is possible to firmly support the semiconductor stack 50.

The semiconductor stack 50 is positioned on the support substrate 71, and comprises a p-type compound semiconductor layer 57, an active layer 55, and an n-type compound semiconductor layer 53. The p-type compound semiconductor layer 57 is positioned closer to the support substrate 71 than the n-type compound semiconductor layer 53, like in a general vertical-type LED. The semiconductor stack 50 is positioned on a portion of the support substrate 71. That is, the support substrate 71 has an upper surface area that is larger than the footprint of the semiconductor stack 50. As such, the semiconductor stack 50 may be surrounded by edge regions of the support substrate 71.

The n-type compound semiconductor layer 53, the active layer 55, and the p-type compound semiconductor layer 57 may be formed of a nitride-based compound semiconductor, e.g., an (Al, Ga, In)N semiconductor. Each of the n-type and p-type compound semiconductor layers 53 and 57 may have a single or multi-layered structure. For example, the n-type compound semiconductor layer 53 and/or the p-type compound semiconductor layer 57 may comprise a contact layer and a cladding layer, and may comprise a superlattice layer. The active layer 55 may have a single or multiple quantum well structure.

The n-type compound semiconductor layer 53 is positioned distal to the support substrate 71, so that an upper surface 53a of the n-type compound semiconductor layer 53 can be easily roughened. The roughened upper surface 53a enhances the extraction efficiency of light generated in the active layer 55. Side surfaces 53b, 55a, and 57a of the n-type compound semiconductor layer 53, the active layer 55, and the p-type compound semiconductor layer 57 may also be roughened, thereby enhancing the light extraction efficiency. The roughening can be performed using a dry or photo-enhanced chemical (PEC) etching technique.

In particular, the roughening may include forming protrusions on the surfaces 53a, 53b, 55a, and 57a, which may be referred to as exposed surfaces of the semiconductor stack 50. Specifically, the surfaces 53b, 55a, and 57a may be referred to collectively as side surfaces of the semiconductor stack 50, and the surface 53a may be referred to as an upper surface of the semiconductor stack 50. The protrusions may be formed to extend in the same direction. Accordingly, all or most of the light generated in the active layer 55 can be emitted from the semiconductor stack 50 in a single direction. As such, the light emitting efficiency can be enhanced. Further, it is possible to enhance the efficiency of light emitted in a specific direction, as compared with other directions, by changing PEC etching conditions.

The p-electrode 60 is positioned between the p-type compound semiconductor layer 57 and the support substrate 71, and is in ohmic contact with the p-type compound semiconductor layer 57. The p-electrode 60 may comprise a reflection layer 59 and a protection layer 61. The reflection layer 59 may be embedded in the protection layer 61, between the semiconductor stack 50 and the support substrate 71. The reflection layer 59 may be formed of a reflective metal such as Ag, for example, and the protection metal layer 61 may be formed of Ni, for example. The protection layer 61 may completely cover an upper surface of the support substrate 71. Thus, a portion of the protection layer 61 is exposed outside of the semiconductor stack 50.

A p-type bonding pad 65 may be positioned on the exposed portion of the protection layer 61. The p-type bonding pad 65 is electrically connected to the p-type compound semiconductor layer 57 through the p-electrode 60.

The bonding metal 73 is positioned between the support substrate 71 and the p-electrode 60 to bond the semiconductor stack 50 and the support substrate 71. The bonding metal 73 may be formed of, for example, Au—Sn using eutectic bonding or the like. Thus, the p-electrode 60 is flip-bonded to the support substrate 71 by the bonding metal 73.

The n-type compound semiconductor layer 53 is exposed by removing the growth substrate. Meanwhile, the n-electrode 69 is positioned on the upper surface 53*a* of the n-type compound semiconductor layer 53, which is exposed by removing the growth substrate.

A large number of the protrusions (irregularities) are formed on the exposed surfaces of the semiconductor stack 50. Such protrusions may be formed by dry or wet etching. That is, the protrusions are formed on the exposed surfaces 53*a*, 53*b*, 55*a*, and 57*a* of the semiconductor stack 50 using a dry or PEC etching technique. As such, the surface roughness of the semiconductor stack 50 is increased, thereby enhancing the light extraction efficiency thereof.

The PEC etching may be performed in an aqueous solution, while the LED is irradiated with UV light having an energy level greater than the bandgap of GaN. For example, the PEC etching may be performed using a KOH solution as an electrolyte and a Xe lamp as a light source. In the alternative, an Hg lamp may be used as the light source. Here, an etchant, such as $Ga_2O_3$, and an oxidizer may be contained in the KOH solution. Accordingly, the exposed surfaces of the semiconductor stack 50, i.e., surfaces 53*a*, 53*b*, 55*a*, and 57*a* are etched. The etching of the semiconductor stack 50 is related to the grain structure thereof. That is, the PEC etching produces protrusions that extend in accordance with the grain structures of the layers 53, 55, 57 of the semiconductor stack 50.

In a case where the PEC etching is performed on a crystalline compound semiconductor layer, the etching progression rate varies according to the grain pattern at the surface of the compound semiconductor layer. Accordingly, the PEC etching is performed along crystal faces at the surface of the compound semiconductor layer, thereby exposing the crystal faces.

In this procedure, pyramid-shaped protrusions are formed. Since a (10-1-1) plane of GaN is stable, hexagonal pyramid-shaped protrusions are generally formed. The formation of the protrusions is also related to crystalline defects that exist in GaN. Hence, the shapes of the protrusions may vary.

Figure 3:
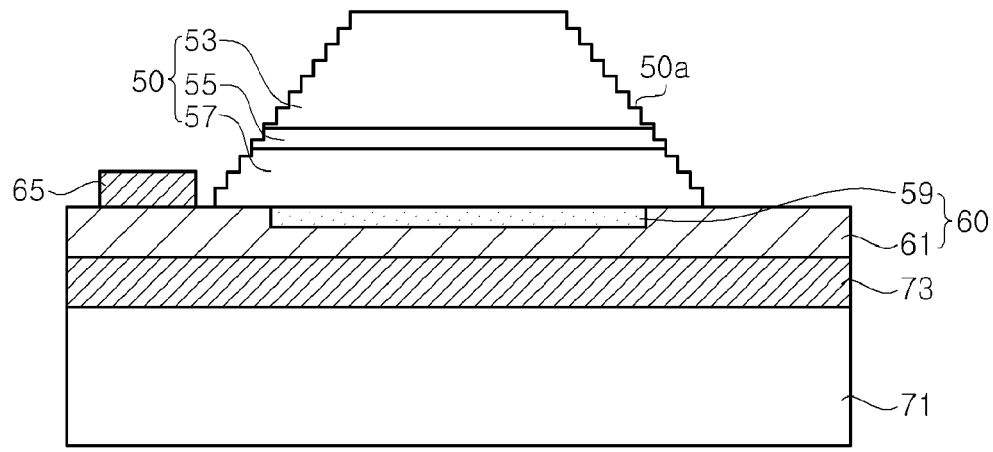
FIG. 3 is a sectional view illustrating a process of fabricating the LED shown in FIG. 2.

FIG. 3 is a sectional view illustrating a process of fabricating the LED shown in FIG. 2, and shows an operation before performing the PEC etching. Referring to FIG. 3, the semiconductor stack 50 has step-shaped sidewalls 50*a*. The step-shaped sidewalls 50*a* may be formed after or during the formation of the semiconductor stack 50.

To this end, a GaN-based n-type compound semiconductor layer 53, a GaN-based active layer 55, and a GaN-based p-type compound semiconductor layer 57 are sequentially formed on a growth substrate (not shown). A p-electrode 60 is formed on the p-type compound semiconductor layer 57. The p-electrode 60 is then bonded to a support substrate 71 with a bonding metal 73. Then the growth substrate is removed, and thus, the n-type compound semiconductor layer 53 is exposed.

Then, portions of the n-type compound semiconductor layer 53, the active layer 55, and the p-type compound semiconductor layer 57 are mesa etched, thereby forming a semiconductor stack 50 disposed on a portion of the support substrate 71.

The side surfaces of the semiconductor stack 50 may be formed to have a stepped structure, during the mesa-etching. That is, during the mesa etching process, the area over which the mesa-etching is performed is decreased, at set intervals. Thus, the mesa-etching area adjacent to a protection metal layer 61 is minimized, and the mesa-etching area adjacent to the upper portion of the semiconductor stack 50 is maximized.

In other words, the mesa-etching occurs over a larger area at the upper portion of the semiconductor stack 50, during a first etching period. In subsequent mesa etching periods, the mesa etching area is incrementally decreased. As such, the width of the semiconductor stack 50 is increased in a stepwise fashion, resulting in the step-shaped side surfaces 50*a*, as shown in FIG. 3. After the mesa etching is completed, an n-electrode 69 is formed on an upper of the n-type compound semiconductor layer 53. Then the semiconductor stack 50 is subjected to PEC etching, thereby completing the LED shown in FIG. 2.

Figure 4:
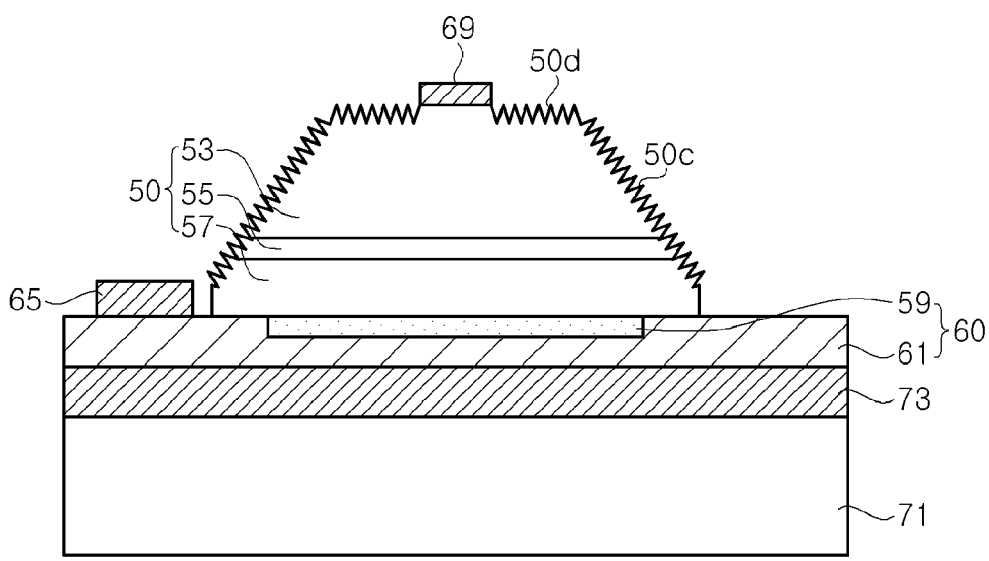
FIG. 4 is a sectional view illustrating an LED, according to another exemplary embodiment of the present invention.

FIG. 4 is a sectional view illustrating an LED, according to another exemplary embodiment of the present invention. Referring to FIG. 4, protrusions 50*c* are formed on the side surfaces and protrusions 50*d* are formed on the upper surface of a semiconductor stack 50. The protrusions 50*c*, 50*d* are similar to those described in the LED shown in FIG. 2. However, while the protrusions shown in FIG. 2 extend in the same direction, the protrusions 50*c*, 50*d* are angled at different directions with respect to the substrate 71.

Figure 5:
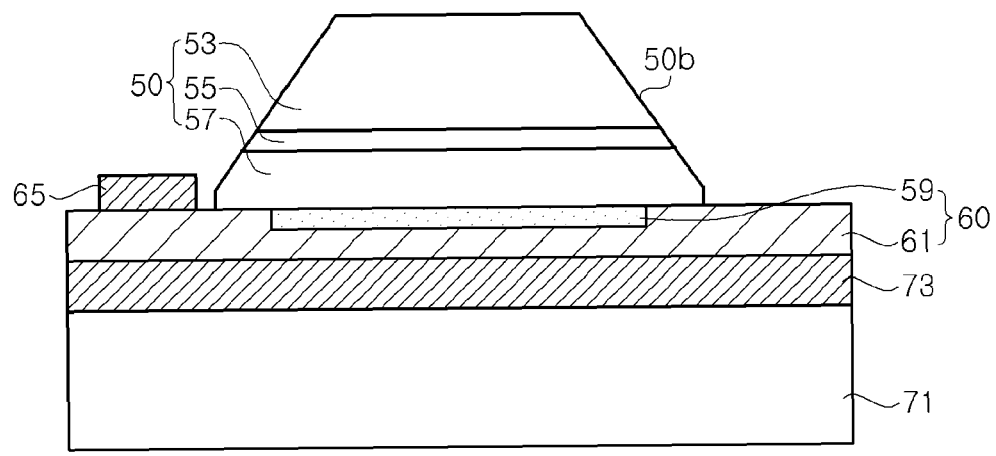
FIG. 5 is a sectional view illustrating a process of fabricating the LED shown in FIG. 4.

FIG. 5 is a sectional view illustrating a process of fabricating the LED shown in FIG. 4, which shows a step before performing PEC etching. As can be seen in FIG. 5, the semiconductor stack 50 has gently inclined side surfaces 50*b*. The side surfaces 50*b* of the semiconductor stack 50 may be formed to have, for example, an inclination angle of 120 to 150 degrees with respect to the upper surface of the semiconductor stack 50. However, the present invention is not limited thereto, as the inclination angle may be appropriately varied, depending on the performance conditions of the PEC etching and the materials of the semiconductor stack 50. The inclined side surfaces 50*b* may be formed after the semiconductor stack 50 is disposed on a support substrate 71.

To this end, a GaN-based n-type compound semiconductor layer 53, a GaN-based active layer 55, and a GaN-based p-type compound semiconductor layer 57 are sequentially formed on a growth substrate (not shown). A p-electrode 60 is formed on the p-type compound semiconductor layer 57. The p-electrode 60 is bonded to a support substrate 71 through a bonding metal 73. Then the growth substrate is removed to expose the n-type compound semiconductor layer 53. Then, portions of the n-type compound semiconductor layer 53, the active layer 55 and the p-type compound semiconductor layer 57 are etched, thereby forming the semiconductor stack 50.

A photoresist pattern (not shown) is formed on the upper surface the semiconductor stack 50. The photoresist pattern is formed to cover the upper surface of the light emitting region. The photoresist pattern is adjusted, so that portions of the photoresist pattern are inclined with respect to the upper surface of the support substrate 71. Accordingly, the edges of the photoresist patterns may be formed to be inclined with respect to the upper surface of the support substrate 71.

An etch stop pattern (not shown) for defining an upper surface of the light emitting region may be formed before the photoresist pattern is formed. The etch stop pattern is preferably formed of a material having a lower etching selectivity for an etchant used for etching the semiconductor stack 50, and may be formed of a metallic material, for example.

Subsequently, the semiconductor stack 50 is sequentially etched using the photoresist pattern as an etching mask. Accordingly, the shape of the photoresist pattern is transferred to the semiconductor stack 50, so that the semiconductor stack 50 has inclined side surfaces, as shown in FIG. 5.

Although it has been described in the aforementioned exemplary embodiments that the p-type compound semiconductor layer 57 is positioned closer to the support substrate 71 than the n-type compound semiconductor layer 53, the present invention is not limited thereto. For example, the n-type compound semiconductor layer 53 may be positioned closer to the support substrate 71 than the p-type compound semiconductor layer 57. In this case, the polarities of the n-electrode 69, the p-electrode 60, and the p-type bonding pad 65 are reversed.

Figure 6:
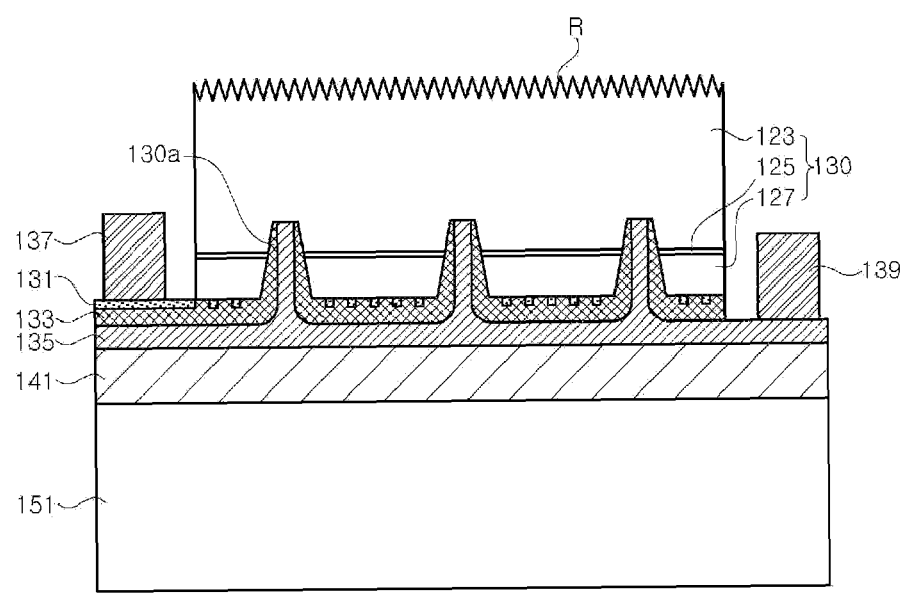
FIG. 6 is a sectional view illustrating an LED, according to a further exemplary embodiment of the present invention.

FIG. 6 is a sectional view illustrating an LED, according to a further exemplary embodiment of the present invention. Referring to FIG. 6, the LED comprises a support substrate 151, a semiconductor stack 130, openings 130a, a p-electrode 131, a reflective insulating layer 133, and an n-electrode 135. The LED may also comprise a p-electrode pad 137, an n-electrode pad 139, and a bonding metal 141.

The support substrate 151 is similar to the support substrate 71. As such, the support substrate 151 will not be described in detail.

The semiconductor stack 130 is positioned on the support substrate 151, and comprises a p-type compound semiconductor layer 127, an active layer 125, and an n-type compound semiconductor layer 123. The p-type compound semiconductor layer 127 is positioned closer to the support substrate 151 than the n-type compound semiconductor layer 123, like a general vertical-type LED. The semiconductor stack 130 may be positioned on a portion of the support substrate 151.

The n-type compound semiconductor layer 123, the active layer 125, and the p-type compound semiconductor layer 127 are similar to those described in FIG. 2. Thus, only the differences there between will be described in detail. The n-type compound semiconductor layer 123 may have a roughened surface R to enhance the extraction efficiency of light generated in the active layer 125. Also, the roughened surface R may be formed on the side surfaces of the semiconductor stack 130, as described with respect to FIGS. 2 and 4. The semiconductor stack 130 may have step-shaped or inclined side surfaces.

Opening(s) 130a are formed in the p-type compound semiconductor layer 127 and the active layer 125, to expose portions of the n-type compound semiconductor layer 123. The opening 130a may be in the form of a hole, groove, or trench, or may include a plurality of the same. For example, each opening 130a may be formed in the shape of a hole, and a plurality of the holes may be arranged in a matrix.

The p-electrode 131 is positioned between the p-type compound semiconductor layer 127 and the support substrate 151, and is in ohmic contact with the p-type compound semiconductor layer 127. The p-electrode 131 may be formed to have openings through which the p-type compound semiconductor layer 127 is exposed. Although it has been shown in this figure that portions of the p-electrode 131 are spaced apart from one another, they are actually connected to one another. For example, the p-electrode 131 may be formed as a matrix or mesh. Also, the p-electrode 131 may be formed of a transparent metal such as Ni/Au, a transparent conductive oxide, such as an ITO or ZnO, or a reflective metal. A portion of the p-electrode 131 is exposed outside of the semiconductor stack 130.

The n-electrode 135 is positioned between the p-electrode 131 and the support substrate 151, and contacts the n-type compound semiconductor layer 123 through the openings 130a. The n-electrode 135 may be in ohmic contact with the n-type compound semiconductor layer 123. A portion of the n-electrode 135 may be exposed outside of the semiconductor stack 130.

The reflective insulating layer 133 insulates the n-electrode 135 from the p electrode 131. The reflective insulating layer 133 has a higher reflectance than Al or Ag, and may include, for example, at least one element selected from Si, Ti, Ta, Nb, In, and Sn. In addition, the reflective insulating layer 133 may be formed by alternately stacking at least two layers selected from $Si_xO_yN_z$, $Ti_xO_y$, $Ta_xO_y$, and $Nb_xO_y$ layers, and may be a distributed Bragg reflector (DBR). The DBR can maximize the reflectance for light of a specific wavelength by adjusting the optical thicknesses of high and low refractive index layers alternately stacked therein. Thus, a DBR having reflectance optimized according to the wavelength of light generated in the active layer 125 can be formed. For example, the reflective insulating layer 133 may be optimized for the reflectance of ultraviolet, visible, or infrared light.

The reflective insulating layer 133 may be disposed in the openings formed in the p-electrode 131. Thus, a portion of the reflective insulating layer 133 can be in direct contact with the p-type compound semiconductor layer 127. The reflective insulating layer 133 may also cover sidewalls of the openings 130a. Thus, it is possible to prevent short circuits between sidewalls of the p-type compound semiconductor layer 127 and the active layer 125. Furthermore, the reflective insulating layer 133 can reflect the light formed by the semiconductor stack 130, away from the substrate 151. Thus, a light path can be shortened within the semiconductor stack 130, thereby reducing light loss. Particularly, in order to enhance the light extraction by the reflective insulating layer 133 in the openings 130a, the openings 130a may be V-shaped.

The p-electrode pad 137 and the n-electrode pad 139 may be respectively positioned on portions of the p-electrode 131 and the n-electrode 135 that are exposed outside of the semiconductor stack 130. Accordingly, it is possible to provide an LED in which the p-electrode pad 137 and the n-electrode pad 139 are formed on the same side of the support substrate 151.

The bonding metal 141 may be positioned between the support substrate 151 and the n-electrode 135. The bonding metal 141 may be similar to the bonding metal 73.

According to this exemplary embodiment, the reflectance of light away from the substrate 151 is increased by employing the reflective insulating layer 133, which has better process-stability and a higher reflectance than Al or Ag, so that it is possible to provide a high-efficiency LED having high light extraction efficiency. Further, the n-electrode 135 and/or the n-electrode pad 139 are disposed below the n-type compound semiconductor layer 123, so that it is possible to prevent light once generated in the active layer from being absorbed or reflected thereby, thus improving light extraction efficiency.

Hereinafter, a method of fabricating the high-efficiency LED of FIG. 6, according to an exemplary embodiment of the present invention, will be briefly described. First, an n-type compound semiconductor layer 123, an active layer 125, and a p-type compound semiconductor layer 127 are grown on a growth substrate (not shown) such as a sapphire substrate. Subsequently, one or more openings 130a, through which the n-type compound semiconductor layer 123 is exposed, are formed by etching the p-type compound semiconductor layer 127 and the active layer 125. Then, a p-electrode 131 is formed on the p-type compound semiconductor layer 127. The p-electrode 131 may have a matrix of openings to expose portions of the p-type compound semiconductor layer 127. A reflective insulating layer 133 is formed on the p-electrode 131. The reflective insulating layer 133 covers the p-electrode 131 and may be disposed in the plurality of openings formed in the p-electrode 131. The reflective insulating layer 133 may also cover sidewalls in the opening 130a. The reflective insulating layer 133 may be formed to contact the n-type compound semiconductor layer 123.

Subsequently, an n-electrode 135 is formed on the reflective insulating layer 133. The n-electrode is electrically connected to the n-type compound semiconductor layer 123 through the openings 130a. Then, a bonding metal layer is formed on the n-electrode 135, and a bonding metal layer is also formed on a support substrate 151. Then, these metal layers are bonded to each other. Accordingly, a bonding metal 141 is formed, and the support substrate 151 is bonded to the compound semiconductor layers 123, 125, and 127.

Thereafter, the growth substrate is removed using a laser lift-off technique or the like, and the n-type compound semiconductor 123 is exposed. Then, a portion of the p-electrode 131 is exposed by removing portions of the compound semiconductor layers 123, 125, and 127, and the n-electrode 135 is also exposed. The semiconductor stack 130 may be formed to have a step-shaped or inclined side surfaces. Protrusions may be formed on the exposed surfaces of the semiconductor stack 130.

A p-electrode pad 137 and an n-electrode pad 139 are respectively formed on the exposed p-electrode 131 and the exposed n-electrode 135. Then, the entire structure is divided into individual LED chips, thereby completing the LEDs.

According to the present invention, an upper surface and side surfaces of the semiconductor stack are roughened, so that it is possible to allow the light, which is generated in an active layer, to be effectively emitted to the outside. Accordingly, it is possible to enhance the light extraction efficiency of an LED. Further, as the semiconductor stack has a step-shaped or inclined sidewall, the formation rate of protrusions through PEC etching is increased, thereby enhancing the light extraction efficiency. Furthermore, as a plurality of protrusions formed on the sidewall of the semiconductor stack are formed to extend in the same direction, the light generated in the active layer can be emitted in the same direction to the outside, and thus, it is possible to enhance the light emitting efficiency in a specific direction.

Also, according to various embodiments of the present invention, it is possible to provide a high-efficiency LED in which the light generated in an active layer is prevented from being absorbed or reflected by an electrode or an electrode pad, thereby enhancing the light extraction efficiency. Further, it is possible to provide a high-efficiency LED capable of enhancing the reflectance of the light away from a support substrate, as compared with a conventional LED that employs a metal reflection layer, by employing a reflective insulating layer together with a p-electrode. Furthermore, the reflective insulating layer can be formed to be a DBR, so that the reflectance can be optimized corresponding to the wavelength of the light generated in the active layer.

Although some exemplary embodiments of the present invention are described for illustrative purposes, it will be apparent to those skilled in the art that various modifications and changes can be made thereto within the scope of the invention without departing from the essential features of the invention. Accordingly, the aforementioned embodiments should be construed not to limit the technical spirit of the present invention but to be provided for illustrative purposes so that those skilled in the art can fully understand the spirit of the present invention. The scope of the present invention should not be limited to the aforementioned embodiments but defined by appended claims. The technical spirit within the scope substantially identical with the scope of the present invention will be considered to fall in the scope of the present invention defined by the appended claims.

What is claimed is:

1. A light emitting diode (LED), comprising:
   a semiconductor stack disposed on a substrate, the semiconductor stack comprising:
   a roughened upper surface;
   a first compound semiconductor layer;
   a second compound semiconductor layer;
   an active layer disposed between the first compound semiconductor layer and the second compound semiconductor layer; and
   openings that extend through the first compound semiconductor layer and the active layer, and expose a portion of the second compound semiconductor layer;
   an insulating layer disposed on the substrate and contacting sidewalls of the openings;
   a second electrode disposed on the substrate and electrically connected to the second compound semiconductor layer; and
   a bonding pad contacting a portion of the second electrode that extends outside of the semiconductor stack.

2. The LED of claim 1, wherein the insulating layer is disposed between portions of the first electrode, such that the first compound semiconductor layer and the first electrode have multiple points of contact.

3. The LED of claim 1, wherein the insulating layer comprises a reflective material.

4. The LED of claim 1, wherein the insulating layer comprises at least two layers selected from $Si_xO_yN_z$, $Ti_xO_y$, $Ta_xO_y$, and $Nb_xO_y$ layers.

5. The LED of claim 1, wherein the insulating layer comprises at least one element selected from Si, Ti, Ta, Nb, In, and Sn.

6. The LED of claim 1, wherein the support substrate is conductive.

7. The LED of claim 1, further comprising a bonding metal disposed between the second electrode and the support substrate.

8. The LED of claim 1, wherein the openings are frusto-conical.

9. The LED of claim 1, wherein the openings extend into the second compound semiconductor layer without extending through the second compound semiconductor layer.

10. The LED of claim 1, wherein the second electrode is electrically connected to the second compound semiconductor layer via the openings.

11. The LED of claim 1, further comprising a first electrode disposed on the insulating layer and contacting the first compound semiconductor layer.

12. The LED of claim 11, further comprising another bonding pad contacting a portion of the first electrode that extends outside of the semiconductor stack.

13. The LED of claim 11, wherein the first electrode comprises at least one element selected from Ni/Au, ITO, and ZnO.

14. The LED of claim 11, wherein the first electrode is mesh-shaped.

15. A light emitting diode (LED), comprising:
    a semiconductor stack disposed on a support substrate, the semiconductor stack comprising:
    a roughened upper surface;
    a first compound semiconductor layer;
    a second compound semiconductor layer;
    an active layer disposed between the first compound semiconductor layer and the second compound semiconductor layer; and openings that extend through the first compound semiconductor layer and the active layer and only partially through the second compound semiconductor layer, the openings exposing a portion of the second compound semiconductor layer;

an insulating layer disposed on the substrate and contacting sidewalls of the openings;

a first electrode disposed on the insulating layer and contacting the first compound semiconductor layer; and a second electrode disposed on the insulating layer and electrically connected to the second compound semiconductor layer.

16. The LED of claim 15, wherein the insulating layer comprises a reflective material.

17. The LED of claim 15, wherein the second electrode is electrically connected to the second compound semiconductor layer via the openings.

* * * * *